United States Patent

Böhme et al.

Patent Number: 5,530,391
Date of Patent: Jun. 25, 1996

[54] FILTER CIRCUIT WITH A RESONATOR OPERATED IN SERIES RESONANCE

[75] Inventors: Rolf Böhme, Bad/Friedrichshall; Johann Burkhart, Pfaffenhofen; Johann Traub, Lauingen; Konrad Hirsch, Freising, all of Germany

[73] Assignee: Temic Telefunken microelectronic GmbH, Germany

[21] Appl. No.: 204,492

[22] Filed: Mar. 2, 1994

[30] Foreign Application Priority Data

Mar. 3, 1993 [DE] Germany .................. 43 06 511.2

[51] Int. Cl.[6] .................................................. H03H 11/12
[52] U.S. Cl. .................... 327/311; 327/552; 327/362; 333/186
[58] Field of Search ...................... 330/107, 303, 330/306; 333/186, 162, 214; 327/551, 553, 552, 311, 312, 382, 554, 557, 558, 559, 362, 555, 556

[56] References Cited

U.S. PATENT DOCUMENTS 4,381,487  4/1983  Erickson .................. 330/306

FOREIGN PATENT DOCUMENTS

| 0313189 | 4/1989 | European Pat. Off. . |
| 0375570 | 6/1990 | European Pat. Off. . |
| 141740  | 5/1980 | Germany . |
| 4306512 | 9/1994 | Germany .................. 327/311 |

Primary Examiner—Timothy P. Callahan
Assistant Examiner—Dinh T. Le
Attorney, Agent, or Firm—Spencer, Frank & Schneider

[57] ABSTRACT

A filter that has a resonator operated in series resonance and a two-pole terminal resonator circuit with a resonator whose electric conductance can be divided into a useful component and a parasitic component. A first differential stage actuated by a signal source and having two active elements whose ground connections are each linked to a respective current source and to a respective connection of the two-terminal resonator. A compensation circuit having two connections and which simulates the parasitic component of the resonator electric conductance is connected to a second differential stage which actuated by the signal source, is of the same type as the first differential stage, and has two active elements whose ground connections are each linked to a respective current source and to a respective connection of the compensation circuit. An evaluation circuit is linked to the two mutually reversed, i.e. connected in phase opposition, output connections of the two differential stages.

19 Claims, 3 Drawing Sheets

FILTER CIRCUIT WITH A RESONATOR OPERATED IN SERIES RESONANCE

DESCRIPTION OF THE PRIOR ART

Filter circuits with resonators are used in, for example, narrow-band, high-amplifying tuned radio frequency receivers, in intermediate-frequency amplifiers or in battery-powered long-wave receivers for time signal transmitters. The resonators used here (in particular piezoelectric resonators, for example quartz resonators), are characterized on the one hand by a closely adjacent sequence of series and parallel resonance and on the other hand by high resonance qualities. In most applications, however, only a simple series resonance or parallel resonance is required. In particular, series resonance is used for the operation filter circuits at relatively low frequencies, since the parallel resonance at higher frequency is practically unusable on account of its high resistivity. For the pure series resonance to make an appearance, the parasitic parallel capacitance (which is always present) of the resonator must be compensated. To this end, a receiver for time signals having a filter designed as a bridge circuit is described in DE-PS 35 16 810; this known receiver has an amplifier with two outputs phase-shifted by 180° to one another, with the one output being connected by a resonator and the other output by a compensation capacitor to the input of the following amplifier. If the capacitance of the compensation capacitor corresponds to the effective parallel capacitance of the resonator, the latter is compensated and hence the required simple resonance characteristics achieved. The drawback of this arrangement is however on the one hand the unsymmetrical mode of operation, which easily leads to faults as a result of the high resonator impedance, and on the other hand the fact that the high input resistances required (since the bandwidth of the filter is determined by the input resistance of the following amplifier, a sufficient bandwidth entails high input resistance values) can be obtained with integrated circuits only at great expense yet with insufficient stability.

SUMMARY OF THE INVENTION

The object underlying the invention is to provide a filter circuit in which the above drawbacks are avoided and that has advantageous properties.

The object is attained in accordance with the invention by the a filter circuit having a resonator operated in series resonance, comprising: a two-terminal resonator circuit including a resonator whose electric conductance includes a useful component and a parasitic component; a first differential stage which is actuated by a signal source, which has two output connections, and which has two active elements whose respective ground connections are connected to ground via respective current sources and to a respective connection of the two-terminal resonator circuit; a compensation circuit which has two connections and which simulates the parasitic component of the resonator electric conductance; a second differential stage which is actuated by the signal source, which has two output connections, which is of the same conductivity type as the first differential stage, and which has two active elements whose ground connections are respectively connected to ground via respective current sources and to a respective connection of the compensation circuit; means connecting the two output connections of the first differential circuit in phase opposition with the two output connections of the second differential circuit; and an evaluation circuit connected to the two mutually connected output connections of the two differential stages.

Advantageous embodiments of the filter circuit are set forth.

BRIEF DESCRIPTION OF THE DRAWINGS

The circuit array and the mode of operation of the filter circuit is described in detail on the basis of FIGS. 1 to 4, in which.

DESCRIPTION OF PREFERRED EMBODIMENTS

Figure 1:
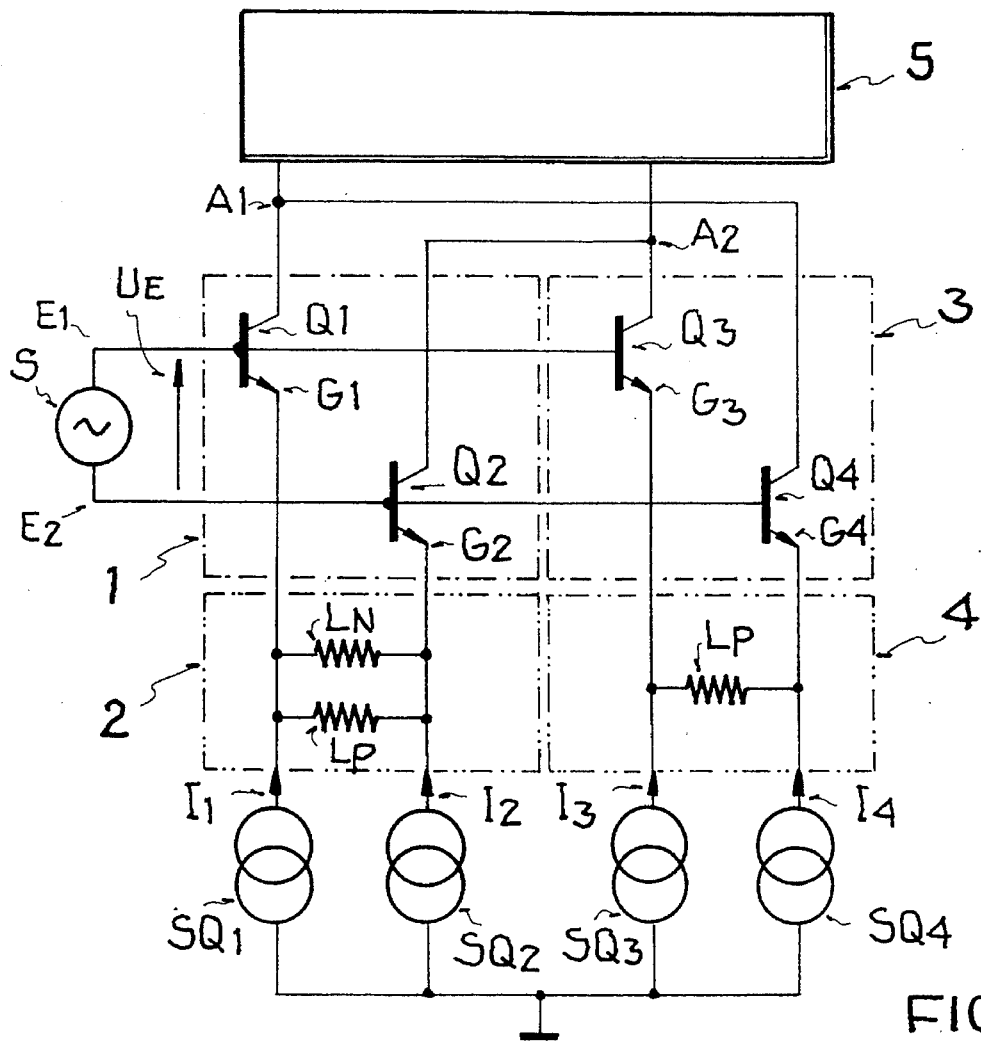
FIG. 1 shows the principle diagram of the filter circuit.
Figure 3A:
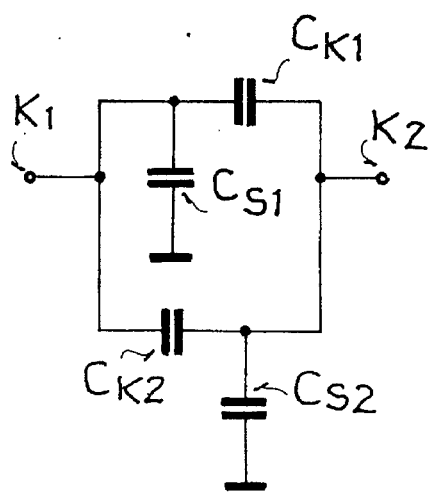
FIGS. 3a–3d show various embodiments of the compensation circuit.
Figure 3B:
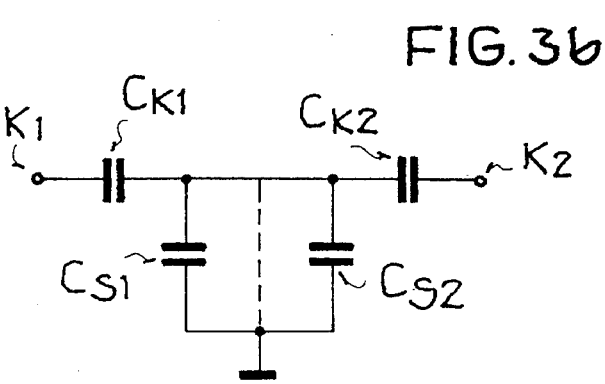
Figure 3C:
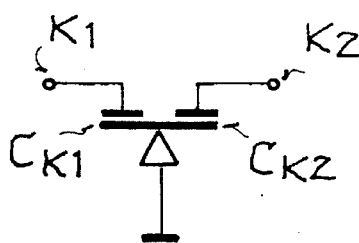

As the principle diagram in FIG. 1 shows, the filter circuit has a first differential stage 1, a two-terminal or two-pole resonator circuit 2, a second differential stage 3 of the same type as the first differential stage 1, a compensation circuit 4 and an evaluation circuit 5. The first differential stage 1 has two active elements $Q_1$, $Q_2$ with the input connections $E_2$, the output connections $A_1$, $A_2$, and the basic connections $E_1$, $G_1$, $G_2$. The resonator circuit 2 contains resonator, for example designed as a quartz resonator (the electric conductance $L_R$ of which can be divided into a useful component $L_N$ and a parasitic component $L_p$). The second differential stage 3 has two active elements $Q_3$, $Q_4$ with the input connections $E_1$, $E_2$, the output connections $A_1$, $A_2$, and the basic connections $G_3$, $G_4$, with the output connections of the second differential stage being reversed in relation to those of the first differential stage. The compensation circuit 4 (which simulates the parasitic component $L_p$ of the resonator's electric conductance $L_R$) has two connections and has, for example, a compensation capacitor or a capacitor circuit. The evaluation circuit 5 is obtained using, for example, load resistors. The input connections $E_1$, $E_2$ of the first differential stage and of the second differential stage 3 are connected to a symmetrical voltage source S supplying the input voltage $U_E$. Each basic or ground connection $G_1$, $G_2$ of the first differential stage 1 is linked to a respective connection of the resonator circuit 2 and to one of the two current sources $SQ_1$, $SQ_2$ respectively (which supply the two supply currents $I_1$ $I_2$); each basic or ground connection $G_3$, $G_4$ of the second differential stage 3 is linked to a respective connection of the compensation circuit 4 and to one of the two current sources $SQ_3$, $SQ_4$ respectively (which supply the two supply currents $I_3$, $I_4$). The evaluation circuit 5 is linked to the output connections $A_1$, $A_2$ of the first differential stage 1 and of the second differential stage 3. The resonator circuit 2 and the compensation circuit 4 can have series resistors that can be linked on one or both sides to the two connections of the resonator circuit 2 or of the compensation circuit 4. When bipolar transistors are used as active elements of the two differential stages (with the same applying for field-effect transistors), the differential output current of the differential stage 1 is inversely proportional to the sum of the impedance $Z_R$ the resonator of the resonator circuit 2, the emitter input resistances of the transistors of the differential stage 1 and, if applicable, the series resistances of the resonator circuit; the emitter input resistances can be selected if necessary such that no series resistors are needed. At the point of series resonance, the amplification of the differential stage 1 is maximum, the impedance $Z_R$ of the resonator drops to the lowest series resonance resistance; in a typically dimensioned array this is substantially lower than the sum of the two emitter input resistances and if applicable of the series resistances. Above the series resonance, the impedance $Z_R$ of the resonator increases rapidly, and the amplification of the differential stage 1 drops (in the 3 dB limit frequency the sum of the two emitter input resistances and of the series resistances is equal to the amount for the impedance $Z_R$ of the resonator); at the parallel resonance point the selection curve of the resonator has an attenuation peak, at higher frequencies the attenuation falls again. The compensation circuit 4 simulates the parasitic resonator electric conductance $L_p$; the second differential stage 3 supplies a capacitively evaluated current which is added to the output current of the first differential stage 1 by the output connections $A_1$, $A_2$ changed over in relation to the first differential stage 1 in the reversed phase position. As a result, the current component determined by the parallel capacitance of the resonator is compensated on the one hand, and the attenuation peak in the selection curve is shifted to infinity on the other hand; the characteristics of the simple (series) resonant circuit are thereby obtained. The bandwidth of the filter circuit depends on the emitter input resistances and hence on the emitter current of the two transistors of the differential stage 1; by presetting the currents $I_1$, $I_2$ of the two current sources $S_{Q1}$, $SQ_2$, the emitter current and hence also the bandwidth of the filter circuit can be adjusted. The transconductance of the second differential stage 3 is set using the currents $I_3$, $I_4$ of the two current sources $SQ_3$, $SQ_4$; as a result, the compensation effects can be varied, and variations in the compensation circuit 4 (for example of the compensation capacitor) and in the parallel capacitance of the resonator can be equalized. Switching off the currents $I_1$, $I_2$, $I_3$, $I_4$ of the current sources $SQ_1$, $SQ_2$, $SQ_3$, $SQ_4$ results in the signal path from the respective current source to the evaluation circuit 5 being interrupted and the filter circuit becoming ineffective. Thus, several filter circuits are disposed such that they are fed from the same signal source and work on the same output circuit, changeover between various filter circuits is possible in this way.

The filter circuit in accordance with the invention combines several advantages:

a symmetrical operating mode is already implicitly laid down by the structure of the circuit array, a well-defined and relatively high input resistance is not necessary, a wide supply voltage range is obtained; the filter circuit can be used at low supply voltages down to about 1 V, particularly when the current sources are designed as transistor current sources with low residual voltage, the current consumption is very low: the filter circuit requires very little current, particularly when the resonator is highly resistive or when a greater bandwidth of the filter circuit is selected, it has advantageous modulation characteristics; the filter circuit can be modulated at the resonance point (thanks to the characteristic of bipolar transistors) to about 20 mV input voltage; outside the resonance point, the rising impedance of the resonator acts as negative feedback, so that correspondingly greater modulations are possible (corresponding to the communications engineering task of selecting a weak useful signal out of undesirable and occasionally very much stronger signals), with an integration of the filter circuit, a low connection capacitance exists: if the circuit is designed as an integrated circuit with externally connected resonator, the latter is only subjected to half the pin capacitance, because the parasitic pin capacitances of both resonator connections act as a series connection due to their symmetrical operation (whereas the full pin capacitance is effective in an unsymmetrical circuit).

Figure 2:
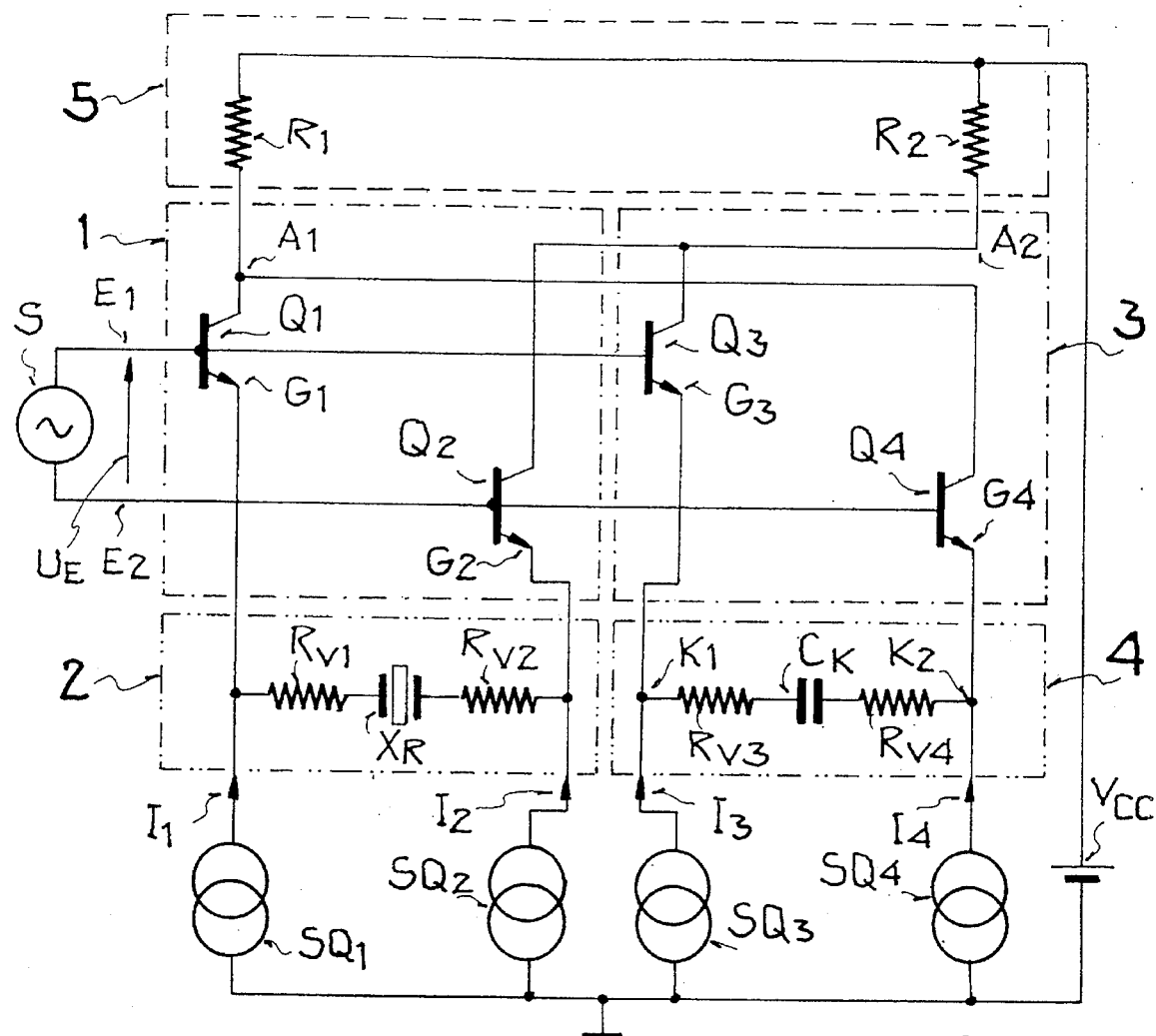
FIG. 2 shows an embodiment of the filter circuit.

In accordance with the filter circuit embodiment shown in FIG. 2, the first differential stage 1 is designed as a first transistor pair with the two NPN transistors $Q_1$ $Q_2$ and the second differential stage 3 as a second transistor pair with the two NPN transistors $Q_3 Q_4$. The interconnected bases of the transistors $Q_1$, $Q_3$ are linked to the first connection (input connection $E_1$) of the signal source S supplying the input AC voltage $U_E$, and the interconnected bases of the transistors $Q_2$, $Q_4$ are linked to the second connection (input connection $E_2$) of the signal source S. Each connection of the resonator circuit 2 (with the resonator designed as a piezoelectric quartz resonator $X_R$ and with the series resistors $R_{V1}$, $R_{V2}$) is connected to a respective emitter of one of the two transistors $Q_1$, $Q_2$ of the first transistor pair (basic connections $G_1$, $G_2$); the emitters of the transistors $Q_3$ $Q_4$ of the second transistor pair (basic or around connections $G_3$, $G_4$) are linked to a connection $K_1$ or $K_2$ of the compensation circuit 4 (which contains the compensation capacitor $C_K$ and the series resistors $R_{V3}$, $R_{V4}$). The emitters of the transistors $SQ_1$, $Q_2$ $Q_3$ $Q_4$ are fed by current sources $SQ_1$, $SQ_2$, $SQ_3$ and $SQ_4$ respectively, which can be designed in the usual way as transistor current sources or high-resistivity resistors. The first output connection $A_1$ of the circuit array is formed by the connection of the collectors of the transistors $Q_1$ and $Q_4$, and the second output connection $A_2$ by the connection of the collectors of the transistors $Q_2$ and $Q_3$; the evaluation circuit 5 in the form of load resistors $R_1$, $R_2$ is linked to the output connections $A_1$, $A_2$ and forms a current mirror circuit. The second differential stage 3 with the transistors $Q_3$, $Q_4$ supplies a capacitively evaluated current which is added to the output current of the first differential stage 1 by the output connections $A_1$, $A_2$ changed over in relation to the first differential stage 1 in the reversed phase position, and as a result the current component determined by the parallel capacitance of the resonator is compensated.

FIG. 3 shows some examples for the design of the compensation circuit when compensation capacitors are used. In an integrated circuit, an electrode of a capacitor is always subject to a parasitic substrate capacitance. In order to nevertheless obtain a symmetrical overall capacitance, the overall capacitance of the capacitor $C_K$ is, in accordance with FIG. 3a, divided into the capacitances of the two capacitors $C_{K1}$ and $C_{K2}$ in antiparallel connection, so that the first connection is subjected to the substrate capacitance $C_{S1}$ and the second connection $K_2$ to the substrate capacitance $C_{S2}$ of the respectively allocated capacitors $C_{K1}$ and $C_{K2}$. As a result of the symmetrical operation, the substrate component does not interfere, but rather contributes to the overall capacitance with $1/(1/C_{S1}+1/C_{S2})$. Another possibility is the series connection of two capacitors $C_{K1}$ and $C_{K2}$ according to FIG. 3b; in the case of symmetrical signals, it is irrelevant here whether or not the connection point is linked to the reference potential. Since the compensation capacitor $C_K$ frequently has relatively low capacitance values and hence parasitic effects are reduced, this embodiment facilitates technical implementation. It is possible using integrated circuit technology—as shown in FIG. 3c—to combine the two capacitors $C_{K1}$ and $C_{K2}$ in one structure. The common counter electrode of the two capacitors $C_{K1}$ and $C_{K2}$ is symbolically connected to ground via a barrier layer.

Figure 3D:
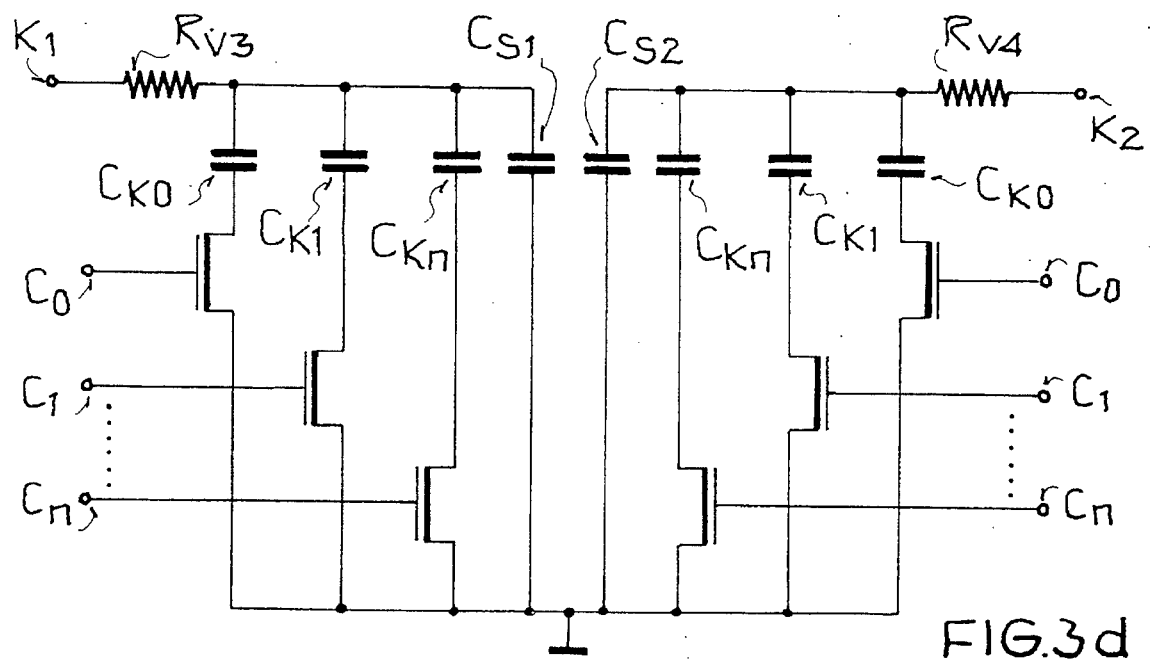
Figure 4:
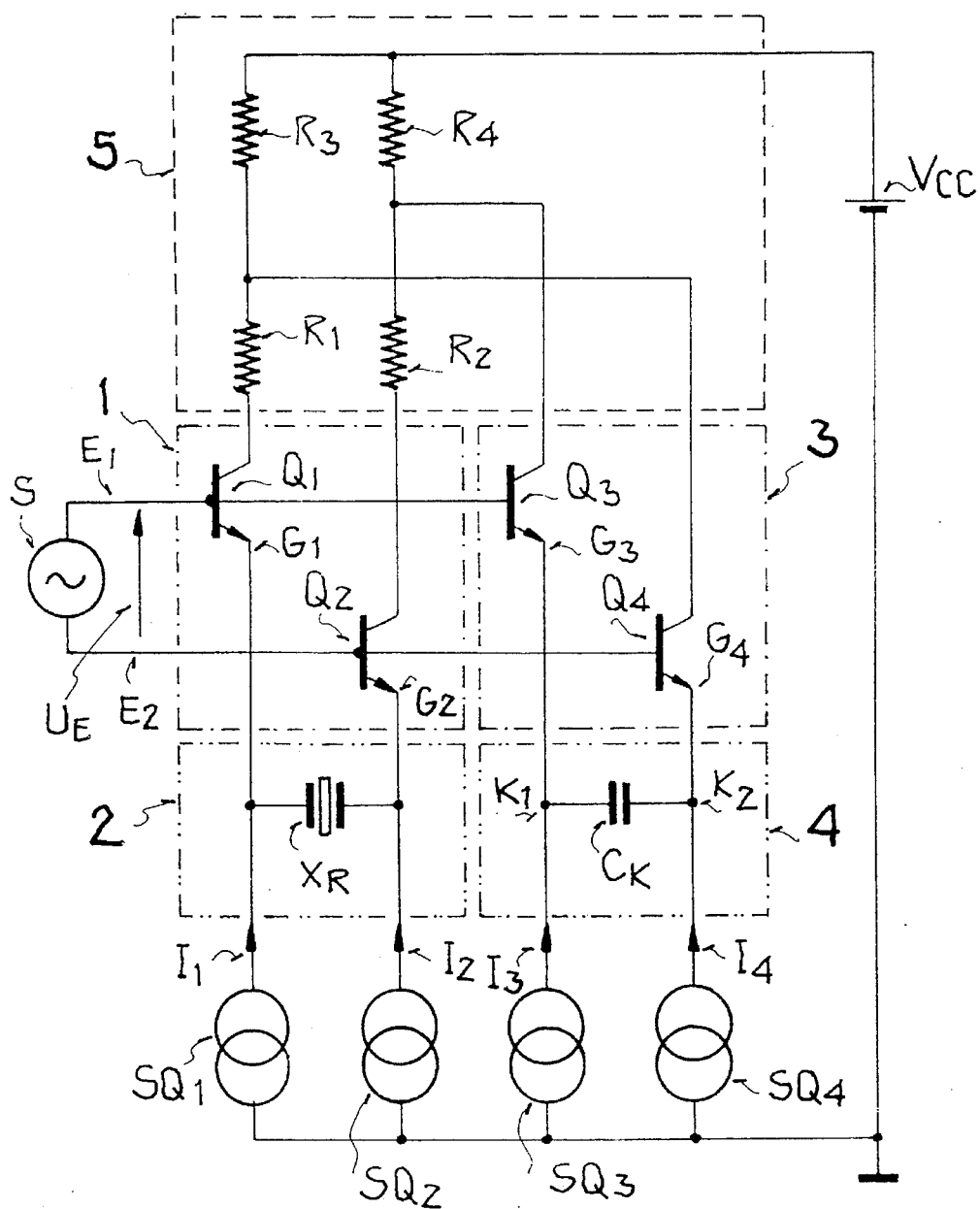
FIG. 4 shows a further embodiment of the filter circuit with reduced noise component.

The embodiment shown in FIG. 3d shows a compensation circuit with digital alignment. Capacitors $C_{K0}, C_{K1}, \ldots, C_{Kn}$ with differing capacitance values are switched on or off using electronic switches. The inputs $C_O, C_1, \ldots, C_n$ of the switches can be actuated by a microcontroller or fixed with a bond wire option (once-only alignment). The capacitance values of the capacitors are weighted for example with $C_{K1} = 2^1 \cdot C_{K0}, \ldots, C_{Kn} = 2^n \cdot C_{K0}$. The circuit shown in FIG. 2 is by its very nature low-noise, because the noise of an emitter resistor ($R_1$, $R_2$) in the ideal case is equal to the noise of a resistor only half as big. In order to reduce the additional noise caused by the compensation circuit, a circuit array according to FIG. 4 can be provided: here the load resistors $R_1$, $R_2$ of the evaluation circuit 5 are divided up and the output connections $A_1$, $A_2$ of the second differential stage 3 (the collectors of the transistors $Q_3$, $Q_4$ carrying the compensation current) are connected to the divider resistors $R_3$, $R_4$. The effect of the compensation current is then reduced by the ratio of $R_3/(R_1+R_3)$ and must be equalized by a correspondingly greater capacitance value of the compensation capacitor $C_K$; if necessary, the supply currents $I_3$, $I_4$ can be increased to this end.

As indicated above, instead of using bipolar transistors, the active elements Q1 and Q2 of the first differential stage and Q3 and Q4 of the second differential stage may be realized by field effect transistors. In such case, the gates of the respective transistors form the two input connections $E_1$ and $E_2$ of the two differential stages, the drains of the transistors form the two output connections $A_1$ and $A_2$ of the two differential stages 1 and 3, and the sources of the transistors form the ground connections $G_1$, $G_2$, $G_3$, and $G_4$ of the two differential stages 1 and 3.

What is claimed:

1. A filter circuit having a resonator operated in series resonance, comprising:

a) a two-terminal resonator circuit including a resonator ($X_R$) whose electric conductance ($L_R$) includes a useful component ($L_R$) and a parasitic component ($L_P$), b) a first differential stage actuated by a signal source (S) and having two output connections and two active elements whose ground connections are respectively connected to ground via respective first current sources and to a respective terminal of said two-terminal resonator circuit, c) a compensation circuit which has two connections and which simulates said parasitic component ($L_P$) of said resonator electric conductance ($L_R$), d) a second differential stage actuated by said signal source (S) and of the same conductivity type as said first differential stage, and having two output connections and two active elements whose ground connection are respectively connected to ground via respective second current sources and to a respective connection of said compensation circuit, e) means connecting said two output connections of said first differential stage in phase opposition with said two output connections of said second differential stage, and f) an evaluation circuit connected to the two mutually connected output connections of said two differential stages for providing a load to said filter circuit.

2. A filter circuit according to claim 1, wherein said two-terminal resonator circuit has a piezoelectric resonator ($X_R$).

3. A filter circuit according to claim 2, wherein said two-terminal resonator circuit includes at least one series resistor connected in series with said piezoelectric resonator ($X_R$).

4. A filter circuit according to claim 1, wherein said compensation circuit includes a capacitor ($C_K$) or a capacitor circuit.

5. A filter circuit according to claim 4, wherein said compensation circuit includes at least one series resistor connected in series with said compensation capacitor ($C_K$) or said capacitor circuit.

6. A filter circuit according to claim 4, wherein said compensation circuit is a capacitor circuit including an antiparallel connection of two integrated capacitors ($C_{K1}$, $C_{K2}$) each having a respective substrate capacitance component ($C_{S1}$, $C_{S2}$).

7. A filter circuit according to claim 4, wherein said compensation circuit is a capacitor circuit including a series connection of two integrated capacitors ($C_{K1}$, $C_{K2}$) each having a respective substrate capacitance component ($C_{S1}$, $C_{S2}$), and where the common connection point of said two series connected capacitors ($C_{K1}$, $D_{K2}$) connects said substrate capacitance components ($C_{S1}$, $C_{S2}$) in parallel and can be connected to a reference potential.

8. A filter circuit according to claim 4, wherein said capacitor circuit has several individual capacitors ($C_{K0}$, $C_{K1}$, $C_{Kn}$) with differing capacitance values, where said individual capacitors ($C_{K0}$, $C_{K1}$, $C_{Kn}$) are switched on or off by electronic switches.

9. A filter circuit according to claim 1, wherein said evaluation circuit comprises respective first and second output resistors connected to respective ones of said output connections of said first differential stage.

10. A filter circuit according to claim 9, wherein said evaluation circuit has two further resistors each connected in series with a respective one of said first and second resistors ($R_1$, $R_2$) respectively, and wherein said means connecting said two output connections connects the respective connection points of said first and second resistors and said two further resistors to respective ones of said output connections of said second differential stage.

11. A filter circuit according to claim 1, wherein said evaluation circuit is a current mirror circuit.

12. A filter circuit according to claim 1, wherein the bandwidth of said filter circuit is adjustable by setting the supply currents of said current sources.

13. A filter circuit according to claim 1, wherein the compensation provided by said compensation circuit of said filter circuit is controllable by setting the supply currents of said current sources.

14. A filter circuit according to claim 1, wherein at least two of said filter circuits are connected in parallel on the output side, and wherein the signal path can be changed over by switching said current sources on or off.

15. A filter circuit according to claim 1, wherein said active elements of said two differential stages are bipolar transistors, where the bases of said transistors form the two input connections of said two differential stages, the collectors of said transistors form said two output connections of said two differential stages, and the emitters of said transistors form the ground connections of said two differential stages.

16. A filter circuit according to claim 1, wherein said active elements said two differential stages are field-effect transistors, where the gates of said transistors form the two input connection of said two differential stages, the drains of said transistors form said two output connections of said two differential stages, and the sources of said transistors form the ground connections of said two differential stages.

17. A filter circuit according to claim 5, wherein said compensation circuit is a capacitor circuit including an antiparallel connection of two integrated capacitors ($C_{K1}$, $C_{K2}$) each having a respective substrate capacitance component ($C_{S1}$, $C_{S2}$).

18. A filter circuit according to claim 5, wherein said compensation circuit comprises a capacitor circuit including a series connection of two integrated capacitors ($C_{K1}$, $C_{K2}$) each having a respective substrate capacitance component ($C_{S1}$, $C_{S2}$), and where the common connection point of said two series connected capacitors ($C_{K1}$, $D_{K2}$) connects said substrate capacitance components ($C_{S1}$, $C_{S2}$) in parallel and can be connected to the reference potential.

19. A filter circuit according to claim 5, wherein said capacitor circuit has several individual capacitors ($C_{K0}$, $C_{K1}$, $C_{Kn}$) with differing capacitance values, where said individual capacitors ($C_{K0}$, $C_{K1}$, $C_{Kn}$) are switched on or off by electronic switches.

* * * * *